United States Patent
Hübel (10) Patent No.: US 7,473,344 B2
(45) Date of Patent: Jan. 6, 2009

(54) SEGMENTED COUNTERELECTRODE FOR AN ELECTROLYTIC TREATMENT SYSTEM

(75) Inventor: Egon Hübel, Feucht (DE)

(73) Assignee: Atotech Deutschland GmbH, Berlin (DE)

( * ) Notice: Subject to any disclaimer, the term of this patent is extended or adjusted under 35 U.S.C. 154(b) by 886 days.

(21) Appl. No.: 10/485,654

(22) PCT Filed: Aug. 21, 2002

(86) PCT No.: PCT/EP02/09343

§ 371 (c)(1),
(2), (4) Date: Feb. 3, 2004

(87) PCT Pub. No.: WO03/018878

PCT Pub. Date: Mar. 6, 2003

(65) Prior Publication Data

US 2004/0232005 A1    Nov. 25, 2004

(30) Foreign Application Priority Data

Aug. 22, 2001  (DE) ............................. 101 41 056

(51) Int. Cl.
*C25D 17/00* (2006.01)
*C25F 3/16* (2006.01)
*C25D 17/28* (2006.01)

(52) U.S. Cl. ............... 205/640; 205/145; 205/686; 204/224 M (58) Field of Classification Search .......... 205/640, 205/145, 686; 204/224 M
See application file for complete search history.

(56) References Cited

U.S. PATENT DOCUMENTS

| 5,024,732 A | 6/1991 | Hübel |
| 5,156,730 A | 10/1992 | Bhatt et al. |
| 6,440,295 B1 * | 8/2002 | Wang .................... 205/640 |

FOREIGN PATENT DOCUMENTS

| DE | 36 45 319 C2 | 1/1988 |
| DE | 41 32 418 C1 | 2/1993 |
| DE | 196 33 797 A 1 | 2/1998 |
| DE | 197 36 351 C 1 | 10/1998 |
| DE | 101 00 297 A 1 | 7/2002 |
| EP | 0 382 254 A 1 | 8/1990 |
| EP | 0 959 153 A2 | 11/1999 |
| WO | WO 00/03426 | 1/2000 |

* cited by examiner

*Primary Examiner*—Arun S Phasge
(74) *Attorney, Agent, or Firm*—Frank J. Bonini, Jr.; John F. A. Earley, III; Harding, Earley, Follmer & Frailey (57) ABSTRACT

In order to even out the electrolytic treatment of workpieces 9 made of electrically non-conductive material and having a very thin base metallising 6, 8, a device is employed in a manner according to the invention comprising means for bringing treatment liquid into contact with the workpieces 9, means 10 for electrical contracting of the workpieces 9 at contacting sites and counterelectrodes 5.x which are so arranged that the workpieces 9 may be arranged opposing them, whereby the counterelectrodes 5.x are each subdivided into at least two electrode segments 13.x such that at least one contact-near electrode segment 13.1 and at least one contact-remote electrode segment 13.4 and possibly further electrode segments 13.2, 13.3 arranged between them are provided and each electrode segment 13.x is fed by a separate current source 15.x.

17 Claims, 5 Drawing Sheets

SEGMENTED COUNTERELECTRODE FOR AN ELECTROLYTIC TREATMENT SYSTEM

DESCRIPTION

The invention concerns a device and a method for electrolytic treatment of workpieces, particularly electric circuit boards and other circuit carriers.

The ever diminishing size of the structures in circuit board technology and Smart Card technology demand very thin base layers, which require to be treated. Previously, these base layers were made by cementing a very thin electrolytic copper film—the copper coating with a thickness of 15-35 µm—onto the electrically non-conductive plastics supporting plate. In fine line circuit boards, these base layers are usually made today by electroless metal deposition. On this base layer, for instance, through-holes and a fine conductor pattern with 50 µm lines and spaces are applied electrolytically. For manufacture of the circuit boards, the reinforced base layer between the electroplated conductor tracks must be removed by chemical etching. In order that the conductor tracks should not be undercut during the etching process, the base layer must be thin. For fine line technology, 2-5 µm thick base layers are used. In SBU (sequential build-up) technology, for instance, base layers of copper made by a electroless process and with a thickness of 0.3-1.0 µm are required.

For the manufacturing of thin metal layers, particularly copper layers, on the circuit board base material, the usual circuit board treatment systems may be used. Such systems are described, for instance, in DE 36 45 319 C2 and DE 41 32 418 C1 herin incorporated by reference. In both documents systems are disclosed in which the circuit board material is fed through the system in a horizontal transport direction. The material is guided in a horizontal transport plane in both cases. DE 36 45 319 C2 describes a conveyorized system for circuit boards with laterally arranged clamps for electrical contact with the products to be treated. In DE 41 32 418 C1, a conveyorized system with contact wheels is disclosed by means of which the circuit boards are contacted laterally.

It has been found that the electrolytic metallizing of circuit board material with a very thin—e.g. 5 µm thick—base metal coating is no longer possible without further measures if a relatively large current density of, say, 10 A/dm$^2$ has been selected for the metallising. In this case, less—or even no—metal is deposited in certain areas which are relatively far removed, for instance 50 cm, from the electrical contact sites through which, for instance by means of the clamps according to DE 36 45 319 C2 or by means of contact rollers according to DE 41 32 418 C1, electric current is fed for metallizing over the base layer (base metallizing).

The aforementioned problem may be alleviated by, for instance, reducing the current density. What is disadvantageous hereby, however, is that the effectiveness and therefore also the economic viability of the electroplating system is reduced. In order to deposit a metal layer of predetermined layer thickness, it is necessary under these conditions to provide sufficiently long treatment systems in which the circuit board material may remain during the necessary metallizing time. The expenditure required in this context for investment and materials and the personnel needed for care, servicing and maintenance result in the operation of such a system being uneconomic.

When using low cathode current densities, it has also proved to be disadvantageous that a thin base layer of copper to be metallized partially or completely dissolves in the sulphuric acid-copper bath typically employed for electrolytic metallizing, so that only the electrically non-conductive base material remains.

Another possibility for avoiding the aforementioned problem consists in finding a different electrical contacting method for the circuit boards.

By way of example, a further conveyorized system for circuit boards is described in EP 0 959 153 A2 which is herein incorporated by reference. In this case, contact rollers are used, which extend transverse to the transport direction over the entire width of the circuit boards. The layer thicknesses for the metal layers that can be deposited with this device are somewhat more even than with the aforementioned devices. However, costly measures are required to prevent metallizing of the contact rollers which are connected on the cathode side.

A further contacting conveyorized system of this type is described in DE 196 33 797 A1 which is herein incorporated by reference. This system has contact and transport rollers across the entire working width.

A great disadvantage with this method of electrical contacting, however, consists in the direct current conduction into the usable area of the circuit boards by means of metal contact rollers, which due to the cathodic polarization, may become loaded with copper particles on the surface. This may lead to damage to the sensitive surface and is therefore not acceptable.

An object of the present invention is therefore to find a device and a method with which in particular an economic operation may be achieved.

A further object of the present invention is to deposit a metal layer on large format workpieces, particularly electric circuit boards and other circuit carriers, without any existing thin base metallizing having a detrimental effect.

Still a further object of the present invention is to find a device and a method being suitable for other electrolytic treatments, which also need to be even over large format workpieces, for instance an electrolytic etching process.

Where workpieces are denoted below as being panel-shaped, these are panels which particularly have holes and/or a relatively low thickness relative to their length and width. Such panel-shaped workpieces may in particular be electrical circuit boards or other circuit carriers.

Electrical circuit boards should also be taken to mean such materials as comprise a panel-shaped laminate made up from a plurality of dielectric and metallic layers and may contain holes (through-holes, buried holes and blind holes). Other circuit carriers include, among other things, non-panel shaped objects used for the electrical connection of electrical components attached and electrically connected to these circuit carriers. These may, for instance, be three-dimensional structures with conductor structures on them. Furthermore, these also include chip carriers including hybrid systems. Fundamentally, workpieces should not be regarded exclusively as electrical circuit carriers, but also products serving other purposes.

Where it is stated below that the workpieces are arranged opposing the counterelectrodes, this should be understood to mean that the counterelectrodes and the workpieces are arranged at a particular separation from each other, preferably in mutually parallel planes in which the counterelectrodes and workpieces are situated, where it is panel-shaped counterelectrodes and workpieces that are concerned. In other cases where the counterelectrodes and workpieces have a complex three-dimensional form, an arrangement should be understood to exist in which the counterelectrodes and workpieces are arranged at a predetermined separation from each other, whereby particular surfaces of the counterelectrodes and workpieces face each other and have an average separation from each other.

Where electrode segments are designated below as contact-near, this should be understood to mean electrode segments, each of which is arranged opposed to at least one region of the workpieces encompassing the electrical contact sites.

Where electrode segments are designated below as contact-remote, this should be understood to mean electrode segments, each of which is arranged opposed to at least one region of the workpieces remote from the contact sites.

Where reference is made below to means for bringing treatment fluid into contact with the workpieces, counterelectrodes, contact sites, means for feeding the workpieces through the device or electrode segments, this is to be taken to mean one or more means for bringing the treatment fluid into contact with the workpieces, one or more counterelectrodes, one or more contact sites on a workpiece, one or more means for feeding the workpieces through the device, or one or more electrode segments.

The device and the method according to the invention serve for electrolytic treatment of workpieces, particularly electrical circuit boards and other circuit carriers. The electrolytic treatment of the circuit carriers may consist therein that they are electrolytically metallized or electrolytically etched or that in some other way an electrolytic treatment is carried out on them. The invention relates particularly to the manufacture of electrical circuit boards and other circuit carriers in conveyorized systems in which the circuit carriers are transported in a horizontal transport direction, brought into contact with treatment liquid in the process, and are electrolytically treated. A preferred application of the present invention consists in the manufacture of electrical circuit boards and other circuit carriers, starting from electrically non-conductive material which is initially provided with a very thin base metallizing on the outer surfaces. The very thin base metallizing is enhanced in the manner according to the invention by means of electrolytic metal deposition.

The device according to the invention includes means for bringing treatment liquid into contact with the workpieces, means for electrically contacting the workpieces at contact sites and to counter electrodes, which are so arranged that the workpieces may be arranged opposing these. In this way, between the workpieces and the counterelectrodes, an electric current can therefore flow. The counterelectrodes are each subdivided in a manner according to the invention into at least two segments such that at least one contact-near electrode segment and at least one contact-remote electrode segment and possibly further electrode segments arranged between these are provided. Each electrode segment is fed by a separate current source. The subdivision of each counterelectrode into at least two electrode segments and the feeding in of electric current into each electrode segment from the separate current source is brought about in such a manner that the extent of the electrolytic treatment is equal or at least approximately the same on all surface areas of the workpieces.

By virtue of the fact that the counterelectrodes are subdivided into electrode segments and every electrode segment is supplied with current from a separate current source—independent of all other electrode segments—, an even electrolytic treatment, particularly electrolytic metal deposition even on a very thin base metallizing on the electrically non-conductive base material of the workpiece may be achieved.

The reason for the solution of the problems described above can be seen from the following, whereby this is explained using the example of the metallizing of electric circuit boards.

When using very thin base metallizing made, for instance, of copper, the problem arises that a large electric potential drop arises in the base metallizing when a relatively large current is selected for the electrolytic treatment. For the ever smaller structures used nowadays in circuit board technology and for SmartCard technology, extremely thin copper layers are used as the base metallizing. These copper layers have a proportionately large electrical resistance. This resistance is up to 100 times higher than that of the formerly usual 17.5 µm thick base layers comprising electrolytic copper, partly because the base metallizing is made in some cases by electroless coppering and the resistance of electroless deposited copper layers is higher than that of electrolytically deposited copper.

Even when using such thin copper layers for the manufacture of circuit boards, the electric current flows distributed in an electrolytic cell through the base metallizing to the electrical contacting means via which the circuit board is electrically connected to a bath current source.

If the electrical contact means of the electroplating system connect in the usual manner at one edge of the circuit board, the entire current must flow through the thin base metallizing to which the current is supplied, specifically beginning at the front and all the way through to the opposing edge. At the start of an electrolytic treatment, for instance, if anodes lie opposite the circuit board material immediately behind the inflow region of a conveyorized system for electrolytic metallizing, a large voltage drop is caused by this current in the still thin base metallizing, so that the locally effective cell voltages are reduced by different amounts. In the case of electrolytic metallizing, the base layer becomes thicker with increasing treatment time and therefore also more conductive. In the case of electrolytic etching, the electrical conductivity decreases in a corresponding manner. In both cases, the surfaces of the circuit board are, in effect, unevenly electrolytically treated on passing through the known processes. In a conveyorized system with, typically, a plurality of anodes for the electrolytic metallizing, it must be possible to treat circuit boards with very different thicknesses of the base layer in a relative range of up to 1:100. The result is very different effective electrolytic treatments from one product to the next.

Since in conveyorized systems, the current is generally fed into the circuit boards on one side, locally varying cell voltages and thus locally varying current densities result. This leads to locally differing layer thicknesses on the circuit board. In the contact area, the layer thickness is large. It decreases continuously, however, with increasing distance from the contact area. The layer thickness differences arising on the circuit boards depend on the thickness, i.e. on the electrical resistance $R_S$ of the base layer, on the electrical resistance $R_E$ of the electrolyte, on the width of the circuit board transverse to the transport direction, which affects the resistance $R_S$ and on the anode/cathode separation, which affects the resistance $R_E$.

Figure 1:
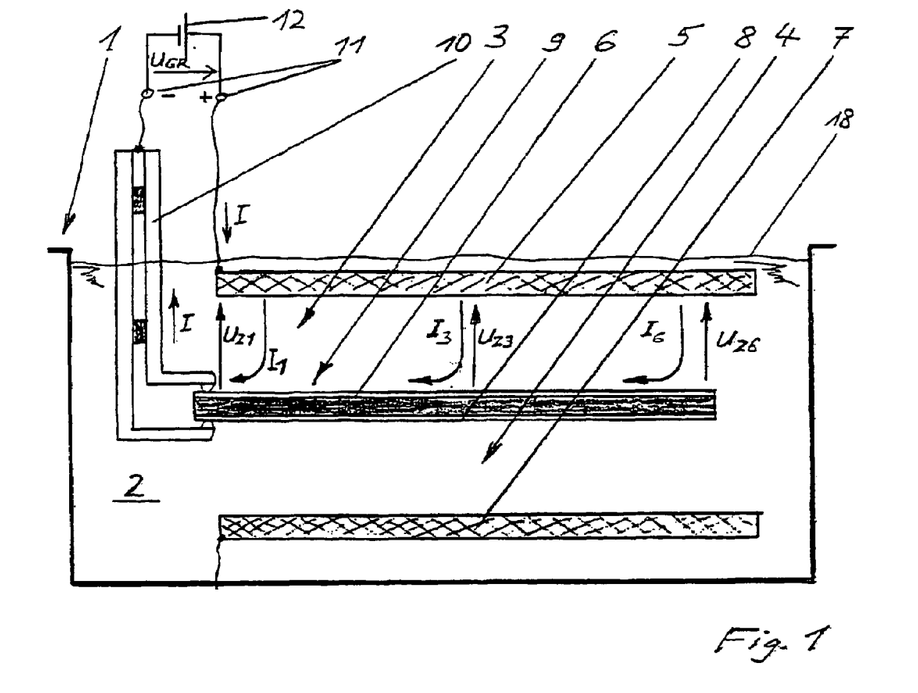
FIG. 1 schematically shows a cross-section through a horizontal conveyorized system without segmentation of the counterelectrodes according to the invention.
Figure 2:
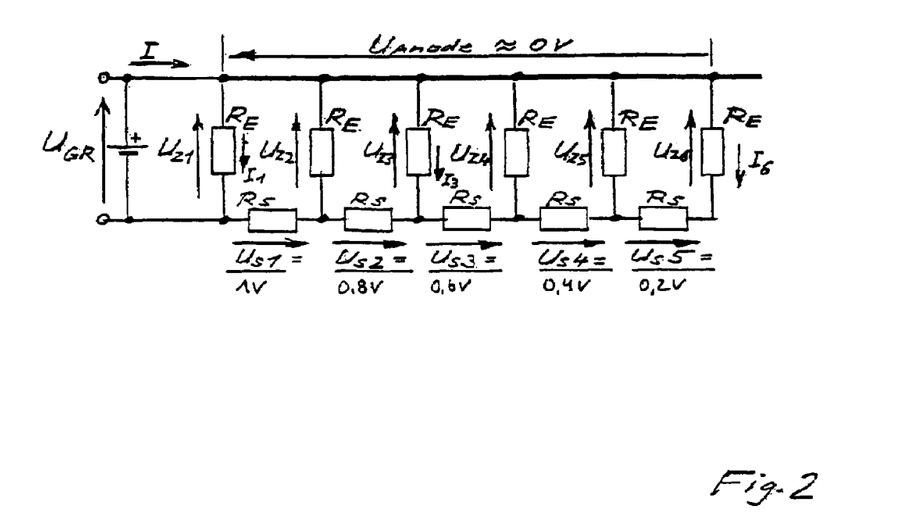
FIG. 2 shows the associated equivalent electrical circuit diagram.

In order to be able to explain the conditions in a horizontal electroplating system under the stated conditions more precisely, reference is made to FIG. 1, in which a schematic cross-section through a horizontal conveyorized system according to the state of the art is shown. FIG. 2 shows the relevant equivalent circuit diagram for the conditions in the system shown in FIG. 1. The reference numbers and other labels in the Figs. are explained below and in the reference number list.

With a typical anode/cathode separation of 80 mm, the output voltage $U_{GR}$ of the rectifier 12 is about 4V in practice. With an anode/cathode separation of 15 mm, the voltage required is reduced to about 2V. If an economically viable current density of about 10 A/dm² at the workpiece is used, the voltage drop in the base layer with a starting layer thickness of 0.5 μm is about $U_{S1}$=1V close to the contact area, whereby the voltage drops $U_{Sx}$ from $U_{S1}$ to $U_{S5}$ fall continuously ($U_{S5}$=0.2V in the contact-remote region).

If these data taken from practice are used in the following formulae:

$$I = I_1 + I_2 + I_3 + I_4 + I_5 + I_6 \quad (1)$$

$$U_{Z1} = U_{GR} \quad (2)$$

$$U_{Z2} = U_{GR} - U_{S1} \quad (3)$$

$$U_{Z3} = U_{GR} - (U_{S1} + U_{S2}) \quad (4)$$

$$U_{Z4} = U_{GR} - (U_{S1} + U_{S2} + U_{S3}) \quad (5)$$

$$U_{Z5} = U_{GR} - (U_{S1} + U_{S2} + U_{S3} + U_{S4}) \quad (6)$$

$$U_{Z6} = U_{GR} - (U_{S1} + U_{S2} + U_{S3} + U_{S4} + U_{S5}) \quad (7)$$

then very different cell voltages $U_{ZX}$ result. The cell voltage $U_{Z1}$ is equal to $U_{GR}$ if slight voltage drops in the electric conductors from the rectifier (current source) to the electrolytic cell are ignored.

$U_{Z2}$ is reduced by the value of the voltage drop $U_{S1}$:

$$U_{Z2} = U_{GR} - U_{S1} = 4V - 1V = 3V$$

From this results a difference in the two cell voltages $U_{Z1}$ and $U_{Z2}$ in the order of 1V or 25% relative to $U_{Z1}$=4V in the contact-near region of the circuit board.

Assuming for the further voltage drops that $U_{S2}$=0.8V, $U_{S3}$=0.6V, $U_{S4}$=0.4V and $U_{S5}$=0.2V, as arise in practice at the start of electroplating of very thin metallic base layers, then the following cell voltages result:

$U_{Z3}$=2.2V
$U_{Z4}$=1.6V
$U_{Z5}$=1.2V
$U_{Z6}$=1.0V

These locally different cell voltages cause different current densities and thus locally different metal layer thicknesses. With increasing layer build-up during the passage of the circuit boards through the electroplating system, the resistance $R_S$ falls off. The relative reduction is all the greater the thinner the base layer to be metallized was at the start of the electroplating. If the cell voltage differences fall significantly during the electroplating process, the unevenness of the coating found at the beginning cannot be evened out. In the above example, the difference in cell voltages at the beginning was 4:1.

If electroplating is performed with a smaller anode/cathode separation, the rectifier voltage $U_{GR}$ diminishes due to the falling electrode resistance $R_E$ to, for instance, 2V. With the same current density as in the above example, the same voltage drops $U_{Sx}$ would have to occur in the base layer. Because, according to the above equations (1) to (7), the cell voltage is $$U_{Z4} = U_{GR} - (U_{S1} + U_{S2} + U_{S3}) = 2V - (1V + 0.8V + 0.6V) = 0V,$$

an electroplating system of this type is not suitable for the treatment of thin metal layers. Under these conditions, the contact-remote region of the circuit board is not electroplating even with increasing electroplating duration in the conveyorized system. In this region, rather, the danger exists that the base layer could be etched away through chemical attack by the electrolyte.

In the treatment system according to EP 0 959 153 A2, in which the circuit boards are contacted with contact rollers, the current fed into the base layer would not flow evenly into all edge areas of the circuit board. With this technique, the differences in the locally acting current density are lower with a thinner base layer than with one-sided feed-in. But in this case also, differences of layer thickness remain, although in the transport direction.

The same applies for the conveyorized system according to DE 196 33 797 A1, in which contact rollers are provided across the entire working width. In this instance, also, the current flows in the usable area of the workpieces, although the aforementioned disadvantages come into play.

The dissolving of the base layer at low current density, which is observed particularly when known electroplating systems are used, in which current is exclusively fed into the base layer through the edge of the circuit boards is attributable to the fact that the electrical cell voltage in the surface areas affected is too low for metallizing, so that metal can dissolve away into the deposition bath. In order to deposit metal, a minimum current density is required to compensate for the chemical etching effect. Otherwise, the contact-remote regions of the circuit board become etched away instead of electroplated despite the low current density. As a result, the voltage drop in the board is further increased.

In the present invention, the conditions described are avoided:

The cell voltage on the individual surface regions on the workpiece may be individually adjusted, with the consequence that the aforementioned voltage fall-off is compensated for. As a result, an even current density and an even electrolytic treatment speed is continuously achieved.

Nor is it necessary to dispense with the advantages of the one-sided edge feed of current as opposed, for instance, to feeding in of current to the workpiece via contact rollers extending across the entire workpiece width. This avoids the sensitive usable area of the workpieces being touched by the contact means. Nor is it necessary to feed current, for instance, from opposing edges into a circuit board. This method has the disadvantage that the separation of the contact means would have to be tuned to the width of the circuit boards.

The current may be fed in near to the edge of the workpiece via contact clamps or contact rollers as the contacting means. The contact rollers may be subdivided into a plurality of segments on the periphery, whereby only the segment rolling along the workpiece delivers the current.

In order that the current should be fed evenly into the workpiece, regulation systems are provided with which the current sources may be controlled. Naturally, it is also possible for the current sources to be set manually. Automatic current regulation is however preferable. This ensures that the respective currents through the individual electrode segments largely compensate for the voltage drops in the base metallizing.

Thus currents may be passed through all the surface areas of the workpieces with substantially the same current density.

The size of the electrode segments should preferably be so chosen that the electrical voltages between neighbouring electrode segments of a counterelectrode are substantially of equal size. This ensures that an equal-sized average current density ($j_1$ to $j_4$) is effective in all regions transverse to the transport direction.

It is also advantageous so to vary the size of the electrode segments of a counterelectrode that it increases from the at least one contact-near electrode segment to the at least one contact-remote electrode segment.

In order to avoid current flowing between the electrode segments, the electrode segments of a counterelectrode between themselves, or those of different counterelectrodes, may be separated by electrically isolated design elements.

The design elements prevent a short-circuit occurring between the electrode segments and are preferably thin walls. This has the effect that the electrical field lines are only slightly attenuated, so that the influence of these separating walls on the electrolytic treatment remains minimal.

In a further preferred embodiment, the electrically non-conductive walls reach close to the workpieces, so that the walls separate electrolytic cells from each other within the treatment system.

The invention is usable particularly for application in horizontal systems for the manufacturing of electrical circuit boards and other circuit carriers. In such systems, suitable transport means are provided for feeding the workpieces through the device with which the workpieces are transported in a transport direction. In the process, the workpieces are electrolytically treated. In such systems, the counterelectrodes are preferably subdivided into electrode segments substantially transverse to the transport direction of the workpieces. If the circuit carriers are transported in an upright position, the counterelectrodes are also arranged upright.

In one embodiment, separating lines which delineate the electrode segments run substantially parallel to the transport direction of the workpieces.

In this case, the separating lines between electrode segments of a counterelectrode are preferably offset relative to separating lines between electrode segments of a neighbouring counterelectrode. This achieves the effect that shielding of the electric field lines, which is indeed slight but cannot be ignored, does not affect the electrolytic treatment at only one site on the workpieces which pass by the electrode segments. Rather, in this case, the shielding effect influences different regions of the workpiece, so that the treatment effect remains substantially even.

In another embodiment of the invention, separating lines which delineate the electrode segments run at an angle $\alpha > 0$ to the transport direction of the workpieces. With this measure, as with that described above, is achieved that the shielding effect does not remain restricted to particular regions on the workpiece surfaces due to insulation present in the separation regions, but is averaged out.

In this case, the separating lines between electrode segments of a counterelectrode may meet separating lines between electrode segments of a neighbouring counterelectrode, so that intersections of the separating lines are produced between neighbouring counterelectrodes. This avoids electrode segments that have different electrical potentials bordering each other directly, so that electroplating and etching effects on the counterelectrodes themselves may be avoided.

In a further development of the aforementioned embodiment of the invention, the separating lines between contact-near electrode segments run at a smaller angle a to the transport direction of the workpieces than the separating lines between contact-remote electrode segments. This measure is taken because the voltage drops in the base layer due to the higher current there close to the clamps (in the contact-near region) are substantially larger per length unit than in the (contact-remote) region further from the clamps. This allows, in the contact-remote region, larger angles $\alpha$ of the separating lines to the transport direction and larger areas of the anode segments to be implemented. Overall, the design cost for a segmented anode is thereby reduced.

Furthermore, a plurality of counterelectrodes may be provided and arranged one behind the other seen in the transport direction of the workpieces. Through subdivision of the counterelectrodes seen in the transport direction, a further adaptation of the respective current densities in the various regions is achieved in order to compensate for different voltage drops in the workpiece areas.

In a conveyorized system, the number of electrode segments of each counterelectrode may fall off in the transport direction of the workpieces. This is favourable for economic reasons. Since the voltage drops in the base metallizing become smaller with increasing layer thickness in the case of an electrolytic metallizing, it is not necessary in the overall system to provide a plurality of electrode segments on the counterelectrodes that serve for further metal deposition on a base metallizing already reinforced by previous metallizing. It may therefore occur that segmentation of a part of the counterelectrodes of a system is no longer necessary.

The invention will now be described using the example, for the sake of simplification, for electroplating where the counterelectrodes are anodes and the workpieces are cathodically contacted. In the following description of the drawings, examples from circuit board technology using insoluble or soluble anodes will be described. However, the invention equally concerns electrolytic etching or any other electrolytic treatment. In principle, in place of circuit boards, other workpieces may naturally also be treated. The following figures aid the description of the invention in more detail.

FIG. 1 serves to illustrate in more detail horizontal conveyorized systems used for the manufacture of electric circuit boards.

In a bath container 1 are situated the electrolyte 2 and the upper electrolytic cell 3, as well as the lower electrolytic cell 4, which are respectively formed by the upper anode 5 and the upper electrically conductive base layer 6 to be metallized, and by the lower anode 7 and the lower base layer 8 to be metallized. The workpiece 9, in this case a circuit board, is held by at least one clamp 10, electrically contacted and transported into the direction of the drawing depth from one anode to the next anode (with the transport direction perpendicular to the drawing plane). Current is fed to the circuit board 9 via the contacts 11 and the clamps 10. The electroplating current I flows distributed—and here represented by different partial currents $I_1$, $I_3$, $I_6$—from the anode 5 to the circuit board 9 via the upper base layer 6 back to the clamp 10. This base layer 6 has a large electrical resistance particularly if it is very thin. Across this resistance, due to the locally different currents, varying voltage drops Us arise. The result is different cell voltages transverse to the transport direction. This produces different partial currents $I_1$, $I_3$, $I_6$, which should, however, be of equal size to achieve equal layer thicknesses in every surface region, i.e. an even current density should be set up.

FIG. 2 shows the electrical resistances and voltage drops in an equivalent electrical circuit diagram for the electrolytic cell 3. The voltage drops in the unilaterally fed anode 5 may in practice be ignored. They amount to about 20 mV. The other voltages to be considered are, in practice, of the order of one volt for thin base layers.

Figure 4:
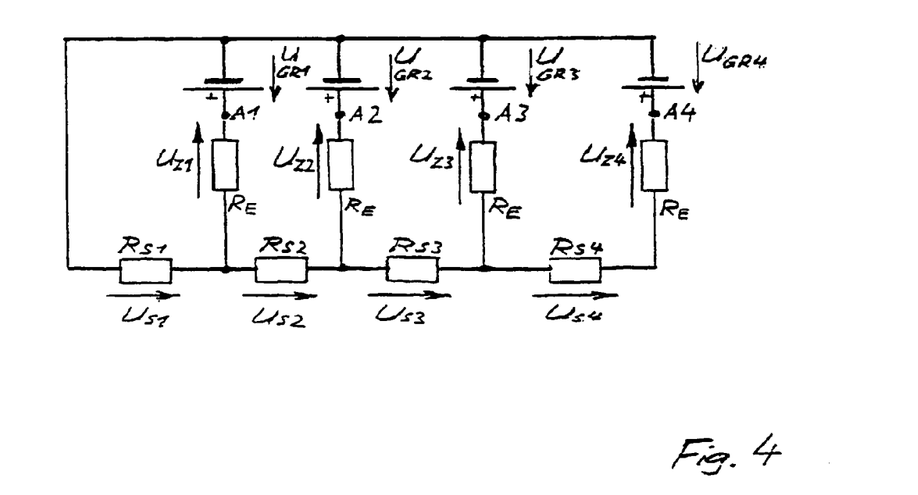
FIG. 4 shows the associated equivalent electrical circuit diagram.

In the equivalent circuit diagrams, the symbols denote the following:

$R_E$ electrolyte resistance of a partial anode/cathode section;

$R_S$ resistance of the base layer of the circuit board transverse to the transport direction;

I overall galvanising current;

$I_X$ partial galvanising current ($I_1$, $I_2$, $I_3$, $I_4$, $I_5$, $I_6$);

$U_{GR}$ rectifier voltage;

$U_{Sx}$ voltage drops in the base layer ($U_{S1}$, $U_{S2}$, $U_{S3}$, $U_{S4}$, $U_{S5}$, $U_{S6}$);

$U_{Zx}$ locally active cell voltages ($U_{Z1}$, $U_{Z2}$, $U_{Z3}$, $U_{Z4}$, $U_{Z5}$, $U_{Z6}$).

The electrolyte resistances RE may be assumed to be equally large in all regions, as is the case for the base layer resistance $R_S$ at the start of the electroplating process for a particular section.

It should be recognised that due to the voltage drops $U_{Sx}$ in the resistors $R_S$ of the base layer and according to the formulae (1) to (7) given above, different cell voltages $U_{Zx}$ apply transverse to the transport direction. This leads to different partial currents $I_1$ to $I_6$. This effect is further amplified in that through the resistances $R_S$ close to the clamps, a much larger current flows than through the resistances $R_S$ further away from the clamps. The overall result is that during electroplating, due to the fall-off in cell voltages $U_{Zx}$, an uneven layer thickness arises, falling off from the clamp 10 to the opposite side of the circuit board 9.

This undesirable layer thickness fall-off is all the greater the smaller the starting thickness of the base layer 6, 8 to be metallized. Furthermore, the layer thickness difference is also greater if the voltages $U_{Zx}$ become smaller relative to the voltages $U_{Sx}$. This is the case if, with the same electrolyte conductivity, the anode/cathode separation is reduced.

Previously in circuit board technology, base layers 6, 8 with a thickness of, for instance, 17 μm have been used. Furthermore, the anode/cathode separations have been about 80 mm. Thus the voltage drops $U_{Sx}$ with economic current densities of 10 A/dm² have lain in the region of 0.02V to 0.06V. The total of all voltage drops in the base layer was therefore ca. 0.2V($U_{S1}$(0.06V)+$U_{S2}$(0.05V)+$U_{S3}$(0.04V)+$U_{S4}$(0.03V)+$U_{S5}$(0.02V)). Due to the large anode/cathode separation, cell voltages of the order of 4V were necessary. The electrolytically effective cell voltages $U_{Zx}$ transverse to the transport direction were therefore between 4.0V and 3.8V. This difference was still tolerable. For the manufacturing of circuit boards, required in increasing numbers using SBU technology, base layers to be metallized made from electroless deposited copper with a thickness of about 0.5 μm are used. Under the same conditions, voltage drops $U_{Sx}$ in the base layer 6, 8 of the order of up to 1 V arise. In the contact-remote circuit board regions, the sum of the voltage drops is equal to the rectifier voltage. The cell voltage is 0V here, as calculated above. Therefore no electroplating takes place in this region, but depending upon the bath composition, etching takes place to a greater or lesser extent. Towards the contact-near region on the circuit board surface (specifically towards the current in-feed), the thickness of the electroplated layer increases from 0 to a maximum. This deficiency of uneven electroplated can only be countered by a significant reduction in the current density. However, this means that the profitability of the process is then strongly reduced.

Figure 3:
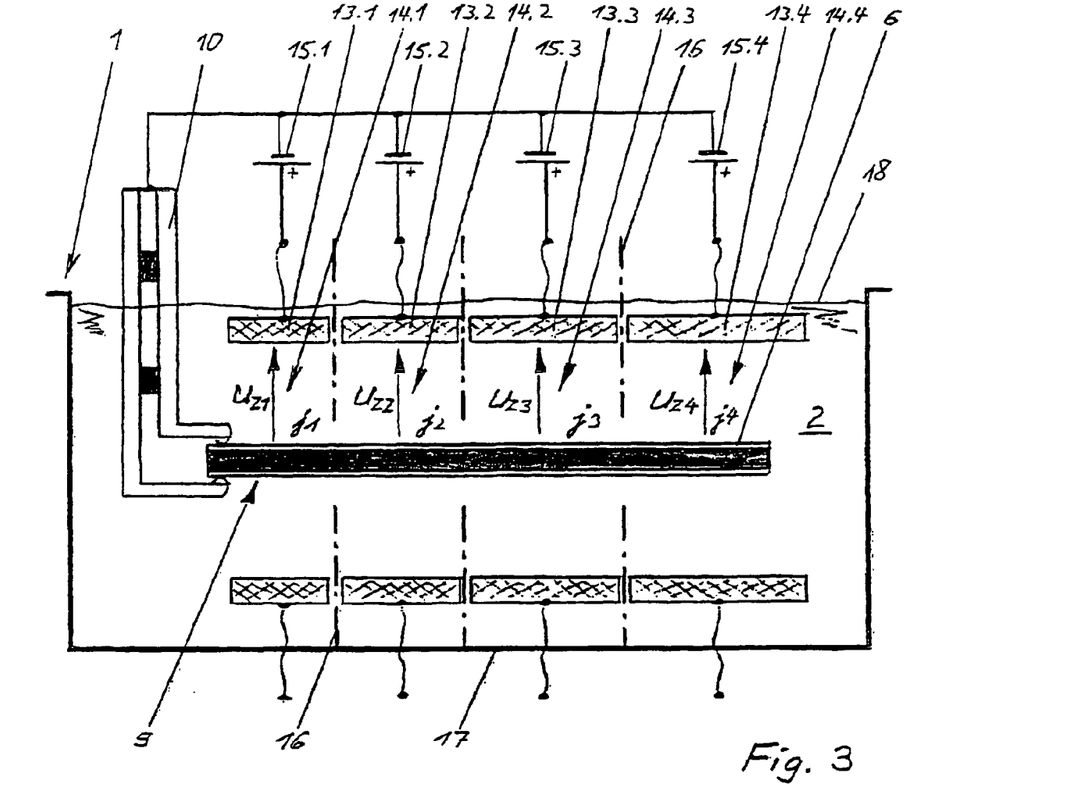
FIG. 3 schematically shows a cross-section through a horizontal conveyorized system according to the invention.

In FIG. 3, the principle according to the invention is schematically shown in cross-section using the example of a horizontal conveyorized system. FIG. 4 shows the associated equivalent electrical circuit diagram. The anodes are divided here into individual electrically isolated anode segments 13.x (13.1, 13.2, 13.3, 13.4) divided transverse to the transport direction. The separating lines of the anode segments in this example run parallel to the transport direction, i.e. into the drawing plane. The anode segments together with the base layer 6 on the circuit board 9 form electrolytic partial cells 14.x (14.1, 14.2, 14.3, 14.4). Each partial cell is fed with current from a separate current source, for instance its own segment rectifier 15.x (15.1, 15.2, 15.3, 15.4). In order to keep the current constant, each current source is equipped with a suitable control unit (not shown), which alters the voltage if the current deviates from the target value. The circuit board 9 to be treated constitutes the cathode of the partial cells 14.x with its upper base layer 6 to be metallized.

In the common cathode 6, a voltage drop Us also arises in the region of a corresponding anode segment. The result of this is that even in these partial areas of the circuit board, different cell voltages $U_{Zx}$ apply. On the contact side, the current density is high here also, while far from the contact it is low. Based on qualitative process-related factors, the maximum permissible current density difference of the circuit boards produced in a conveyorized system therefore determines the required number of anode segments 13.x per anode and the number of such anodes in a system. Large permissible current density differences enable the use of few anode segments and vice versa. The circuit boards run through the system in a particular direction once. Because the current density differences fall off with increasing metallizing of the base layer 6, the number of anode segments per anode may decrease seen in the transport direction of the circuit boards 9. Every anode may contain anode segments individually tailored to requirements and appropriately shaped.

Figure 9:
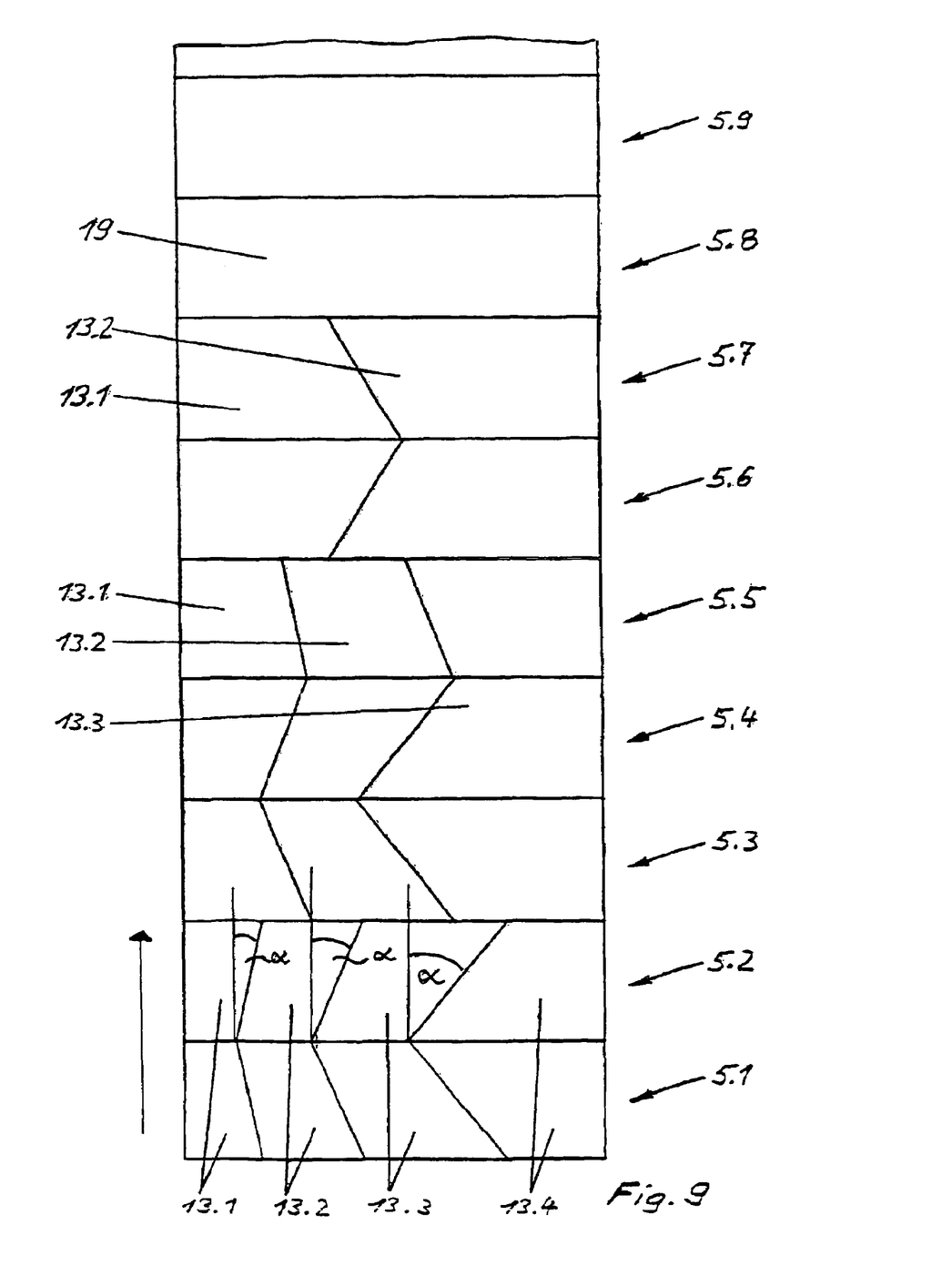
FIG. 9 schematically shows the subdivision of seven first anodes in a conveyorized system into two to four parallel anode segments, respectively, whereby the course of the separating lines between the anode segments is shown.

FIG. 9 shows schematically that each anode may be individually adapted to requirements and that suitably shaped anode segments may be used. In this example, from anode 5.8 no more segmented anodes are used. The anode length in the transport direction (shown by the arrow) is, for instance, 400 mm in practice. The anode width transverse to the transport direction is, for instance, 700 mm. For this purpose, for instance, four anode segments is sufficient for the anodes 5.1 and 5.2 lying immediately behind the inlet region into the conveyorized system.

Each segment rectifier 15.x in FIG. 3 is preferably current-regulated and thus individually adjustable for output voltage $U_{GR}$ (here $U_{GR1}$ to $U_{GR4}$), i.e. the voltage per anode segment is set to such a value that the target current is reached. The symbolically represented segment rectifiers may be direct current sources, unipolar pulse-controlled current sources or bipolar pulse-controlled current sources.

The segment rectifiers 15.x have their current controlled such that an average segment current density results. The output voltage for each segment rectifier is individually adjusted for this purpose. It is dependent upon the electrolytically effective segment area and the necessary average current density for the anode segment 13.x. The current may also be influenced by means of a correction factor comprising an experience-based value. As a normal value for the correction factor, the mid-value of 1 is set. If, for instance, the desired layer thickness on the surface of the circuit board 9 in the region of the current in-feed (the contact-near region) were to be smaller than in the far-removed (contact-remote) region, a correction factor smaller than 1 is selected close to the current in-feed (contact-near region) and larger than 1 in the far-removed (contact-remote) region.

The current may be adjusted by the control system if shorter circuit boards, seen transverse to the transport direction, are to be treated. In this case, the segments far-removed from the holding and contacting clamps 10 are operated with a smaller current corresponding to the smaller circuit board area. On changing-over from one product to another with a different target current density, in practice dummy boards are run through, which should be longer, seen in the transport direction, than the length of an anode (also seen in the direction of travel), in order, on transition from one circuit board product to another, to avoid rejects resulting from unsuitable current densities.

Between the anode segments 13.x are electrically insulated separating walls 16 so arranged that through potential differences arising between the anode segments, no mutual electroplating and etching processes take place. It is advantageous if the separating walls, on the one hand, reach close, for instance, 0.5-5 mm from the circuit boards 9 and, on the other hand, down as far as the tank bottom 17 and upwards as far as above the electrolyte level 18.

FIG. 4 shows the equivalent electric circuit for the electrolytic partial cells 14.x and the segment rectifiers 15.x from FIG. 3. It is the aim to keep the cell voltages $U_{Z1}$, $U_{Z2}$, $U_{Z3}$, $U_{Z4}$ as far as possible the same so that in all regions transverse to the transport direction, the one large average current density ($j_1$ to $j_4$) is effective. From the following equations:

$$U_{Z1} = U_{GR1} - U_{S1} \tag{2a}$$

$$U_{Z2} = U_{GR2} - (U_{S1} + U_{S2}) \tag{3a}$$

$$U_{Z3} = U_{GR3} - (U_{S1} + U_{S2} + U_{S3}) \tag{4a}$$

$$U_{Z4} = U_{GR4} - (U_{S1} + U_{S2} + U_{S3} + U_{S4}) \tag{5a}$$

it can be seen that this can be achieved with different sized output voltages $U_{GRx}$ ($U_{GR1}$, $U_{GR2}$, $U_{GR3}$, $U_{GR4}$) of the segment rectifier 15.x. The anode segments 13.x are equipped with correspondingly dimensioned segment rectifiers. With increasing distance of the anode segments from the in-feed point of the current into the common cathode (the base layer 6, 8 to be electroplated), the output voltage in the rectifier must increase. Starting from a predetermined target current density, for every anode segment a particular current is calculated in a higher-level control system or manually determined, set, and then constantly monitored. If, due to the large voltage drop $U_{SX}$, the current at the beginning of the electroplating process is too small, the output voltage is increased until the target current value is reached. The output voltages which are very high in practice (up to 25V) are only necessary at the start of the electroplating process. With increasing layer thickness of the base layer 6, 8 to be electroplated, due to metal deposition in the conveyorized system, the electrical resistance $R_S$ falls. In corresponding manner, the voltage drops $U_{S1U}$, $U_{S2}$, $U_{S3}$, $U_{S4}$ also decrease in this layer. With increasing circuit board treatment duration, the necessary voltages $U_{GRx}$ of the segment rectifiers become smaller. Thus the technical complexity of the equipment from the in-feed of the conveyorized system also becomes smaller towards the outflow. Thanks to the capability of the segment rectifier to deliver current at a regulated level, so that the required output voltage $U_{GRx}$ sets itself automatically according to the instantaneously prevailing resistances $R_{S1}$, $R_{S2}$, $R_{S3}$, $R_{S4}$, the product-specific target current density is significantly more precisely maintained in all regions of a conveyorized electroplating system than if the counterelectrodes were not segmented.

A horizontal electroplating system for circuit boards comprises, for instance, 15 upper and 15 lower anodes arranged behind one another in the transport direction of the circuit boards 9. The number of anode segments 13.x per anode depends on further parameters. A very thin base layer 6, 8 to be metallized requires segmented anodes along a large transport route. In addition the number of segments per anode must be greater than with thicker base layers 6, 8. At a high transport speed, for instance, 3 m/min, and at a large current density, a larger treatment route must also be equipped with segmented anodes than at a lower transport speed in order to achieve equally good results. When the electroplated layer of the circuit boards in the conveyorized system has reached a relatively large thickness, such as 12 μm, with only slight voltage drops $U_{Sx}$, the number of anode segments and rectifiers 15.x per anode may be reduced or left out entirely to save costs. In any event, the conveyorized system must be equipped for what in this context is the most unfavourable product to be manufactured and the fastest through-flow time, as well as the highest current density.

Figure 5:
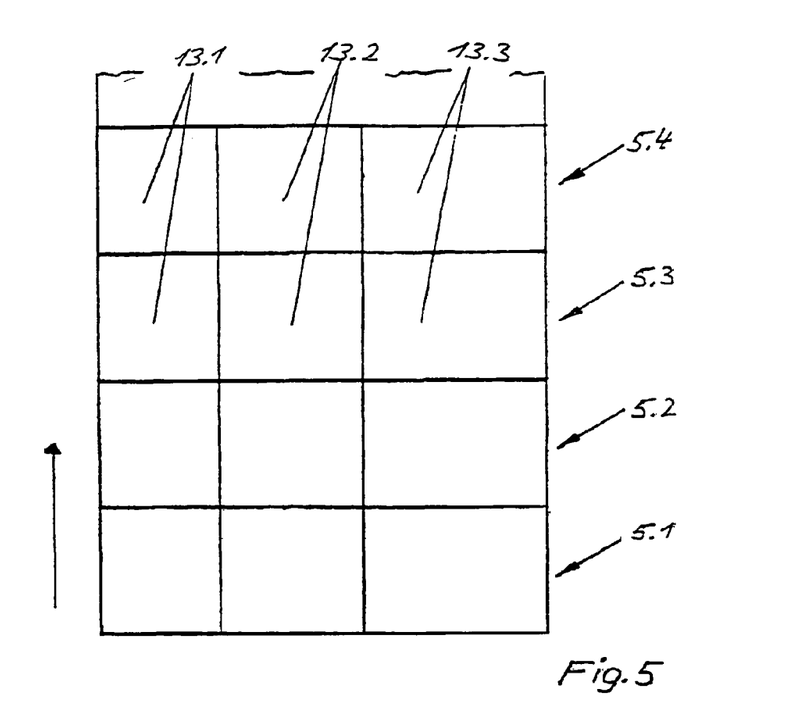
FIG. 5 schematically shows the subdivision of four first anodes in a conveyorized system into three parallel anode segments, respectively; the circuit boards guided along the anodes are electrically contacted on the left side; this applies also for the following FIGS. 6 to 9.

One aim in the system design consists in using as few different components as possible, in order to save costs. This means that each anode 5.x (5.1, 5.2, 5.3, 5.4) should have as far as possible the same shape and number of anode segments 13.x. Between the anode segments, there is preferably an electrical insulation 16, so that each segment may be supplied individually with current at different voltages. This insulation may run parallel to the transport direction, as shown in FIG. 5 (indicated by arrow).

The result of the parallel arrangement consists therein that the deposited layer under such an insulation is somewhat thinner due to shielding of the electric field lines than under the anode segments 13.x themselves. In order to avoid this disadvantage, a different subdivision of the anode segments may be provided from anode to anode 5.x in the transport direction (indicated by arrow). This is shown in FIG. 6.

The latter means that by design, from anode to anode 5.x at least two different anode segments 13.x and, depending on size of the segment area, from anode to anode, differently dimensioned segment rectifiers 15.x are to be provided. This additional cost is avoided by segmentation of the anodes according to FIG. 7, where the separating lines between the anode segments do not run parallel to the transport direction (indicated by arrow) of the circuit boards 9. The anode segments are almost identical in form and size here. Given sufficiently large obliqueness of the separating lines and thus of the segmentation of the anodes and insulation, almost all areas of the circuit boards to be produced are run briefly over or under the insulation area of each anode. In this way, the influence of the insulation on the layer thickness is balanced out.

Figure 6:
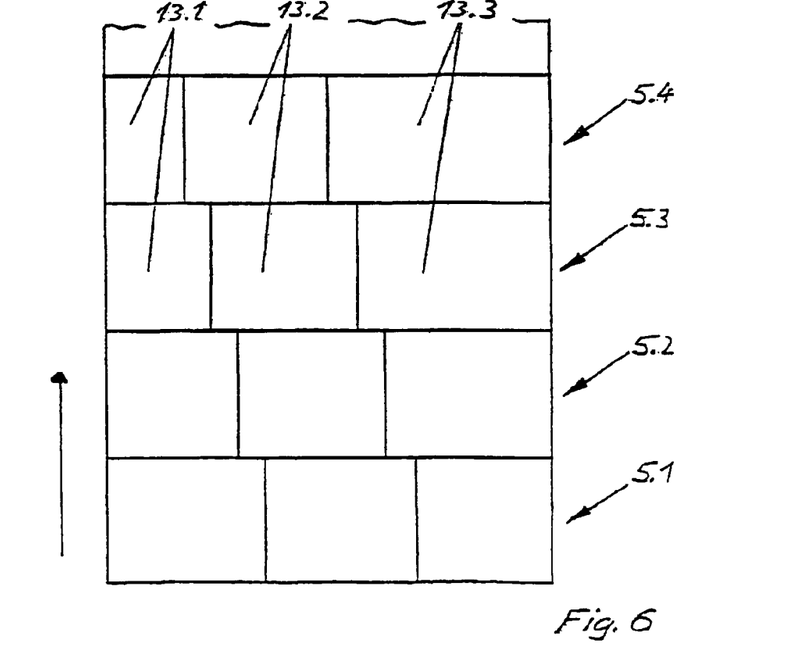
FIG. 6 schematically shows the subdivision of four first anodes in a conveyorized system into three parallel anode segments, respectively, whereby they are offset relative to each other.
Figure 7:
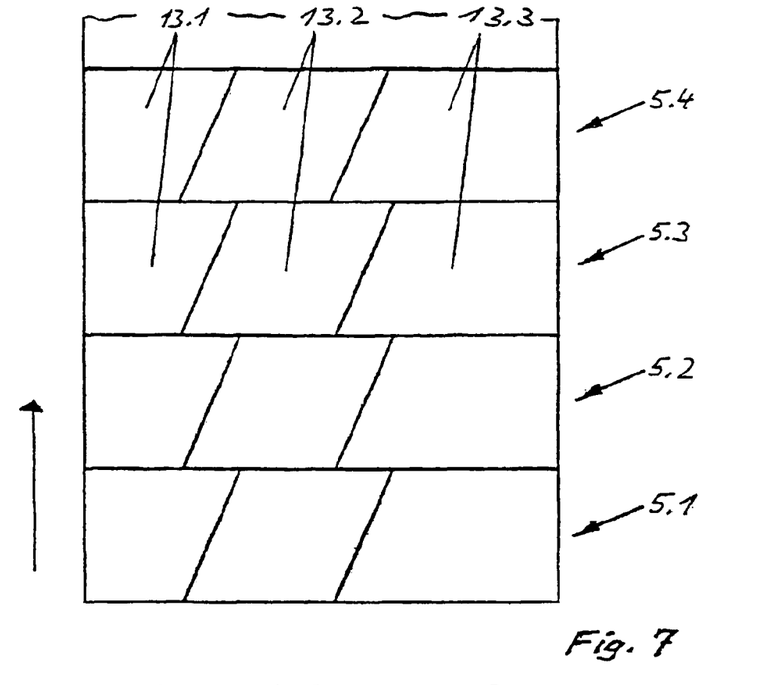
FIG. 7 schematically shows the subdivision of four first anodes in a conveyorized system into three parallel anode segments, whereby these have diagonally arranged separating lines.

In FIGS. 6 and 7, for instance, in one region the anode segment 13.3 of the anode 5.4 borders directly on the anode segment 13.2 of the anode 5.3. The anode segments (13.3 and 13.2) supplying the different regions are operated with markedly different rectifier voltages $U_{GR}$. At the border line between these anode segments, therefore, a voltage difference arises which cannot be ignored. This may lead to etching and electroplating occurring between the anode segments themselves, particularly if the circuit boards extend only partially into the region of these anode segments. This is the case, for instance if the circuit boards do not completely fill up the entire region transverse to the transport direction (indicated by arrow), i.e. if they are narrow and if, at the same time (e.g. where the anode/cathode separation is small), no electrically insulating shields are used between the anodes. This is avoided with the preferred geometry of the anode segments 13.x according to the representation as in FIG. 8. Here only anode segments with the same segment position and thus similar segment voltage adjoin each other. This is achieved in that the separating lines of the adjacent anode segments meet at the join between the anodes 5.x. Furthermore, only two anode versions are needed for the entire conveyorized system, arranged as mirror-images of each other. FIG. 9 also shows that the anode segments may be differently designed in form and size.

Figure 8:
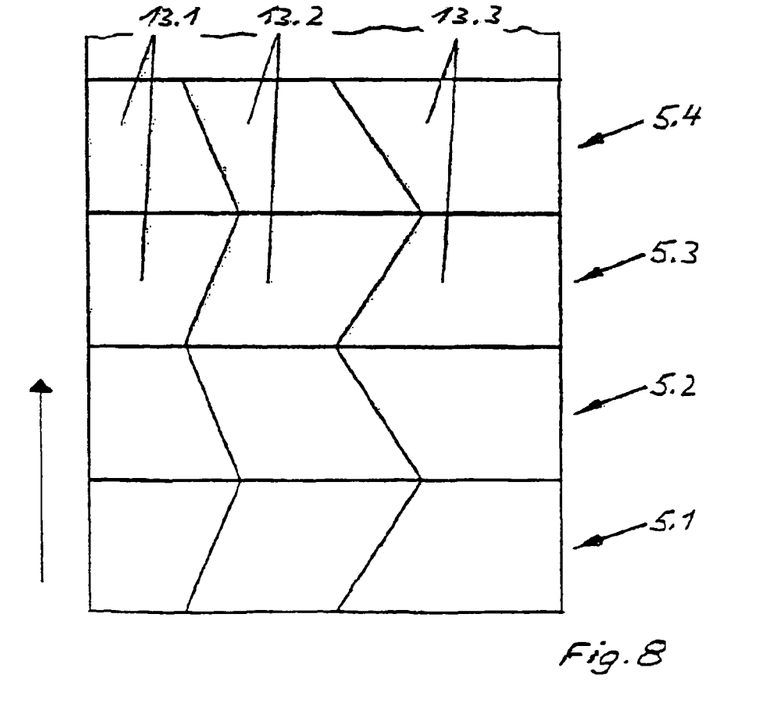
FIG. 8 schematically shows the subdivision of four first anodes in a conveyorized system into three parallel anode segments, respectively, whereby these have diagonally arranged separating lines with mirror-image arrangement of the anode segments.

Due to the mirror-image oblique arrangement of the anode segments 13.x seen in the transport direction, the separating lines of neighbouring anode segments meet at the joins between two adjacent anodes 5.x. A somewhat smaller layer thickness caused by the separation insulation continuously forms on other surface regions of the circuit board 9 due to the forward movement of the boards.

In a preferred embodiment, the angle a relative to the transport direction (indicated by arrow) in the side edge regions of the circuit boards 9 (particularly in the (contact-near) region close to the clamps) should be chosen to be smaller than in the far-removed (contact-remote) region, since the voltage drop-offs in the base layer 6, 8 due to the larger current arising there in the region close to the clamps are substantially greater per unit length than in the region remote from the clamps. This allows larger angles a of the separating lines relative to the transport direction to be realised and larger areas of the anode segments 13.x to be implemented in the region remote from the clamps. Overall, the design cost for a segmented anode is thereby reduced.

The geometry of the anode segments 13.x described and illustrated in FIGS. 5 and 8 will be taken as examples. Further geometries and arrangements, such as are shown in FIG. 9, are also applicable to the invention.

The layer thickness increases from anode to anode 5.x (5.1, 5.2, 5.3, 5.4, 5.5, 5.6, 5.7, 5.8, 5.9). The resistance of the layer decreases in corresponding manner. Between the anodes themselves, therefore, voltage differences arise due to slightly differing output voltages $U_{GR}$ of the segment members 15.x of the order of 0.5V. Therefore the anodes should be insulated from each other just as the individual anode segments are electrically insulated from each other. This anode insulation running transverse to the transport direction has no influence on the layer thickness distribution on the circuit boards 9 since every region of the circuit boards travels in the same way over these insulations.

The number of anode segments 13.x per anode 5.x may, as described above, be different, dependent upon the electroplating conditions in a conveyorized system. The segmentation of the anodes may also be left out entirely in the out-flow region of the conveyorized system if the product specifications allow it. At the in-flow region, narrower segments may be selected than in the middle or at the end of a treatment line in the system if the conductivity of the base layer 6, 8 is particularly low. Limits for this arise only from the economic viability and geometry of the electroplating cells. The invention allows the electroplating of circuit boards with very even layer thicknesses. Through the segmentation of the anodes, on the one hand, and the individual current feed and regulation in these segments, on the other hand, particular regions of the circuit boards 9 transverse to the transport direction may be preferentially electrolytically treated. This is advantageous, for instance, if no segmentation is selected near to the out-flow of the system. By means of a strengthened current level in the region remote from the contact points of the boards at the start of the treatment, a thicker layer may initially be applied here. Through the absence of the segmentation at the end of the treatment line, this region is supplied with less current due to the electrical resistance of the base layer, so that the initial layer thickness difference is balanced out again. A predetermined layer thickness profile may thus be electroplated precisely.

From FIGS. 1 to 4, it can be seen that even within an anode segment 13.x, a voltage drop-off occurs in the base layer 6, 8 to be electroplated. Through the subdivision into a plurality of segments, the voltage drop-off becomes smaller. With an increasing number of anode segments, i.e. with smaller dimensions transverse to the transport direction, the associated voltage drop-offs Us decrease and the cell voltages $U_Z$ become more even. The technical effort for segmentation of the anodes 5.x and for the segment rectifiers 15.x increases, however. Finally, the precision imposed on the treatment goods determines the number of anode segments per anode.

On the corresponding surface region of the circuit board 9 of an anode segment 13.x, an average current density j arises. This current density j is adjusted through the output voltage $U_{GR}$ of the associated segment rectifier 15.x. By means of a higher-order control system or through a manual target value input, a predetermined individual current target value for each anode segment is output at the control of the segment rectifiers 15.x. For the regulation and maintenance of the current, a current maintenance controller of the segment rectifiers independently sets the output voltages $U_{GR}$. This allows production to be carried out if required at current densities j that are larger in the further-removed region from the contact clamps than in the contact-near region. This allows layer thickness differences arising due to partial use of unsegmented anodes 5.x to be effectively equalised.

Towards the current in-feed point, i.e. towards the clamps 10 or contact rollers at the edge of the circuit board 9, the current in the base layer 6, 8 to be metallized increases. The same applies also for the voltage drops $U_S$. If it is suitable that the voltage drops under every anode segment 13.x are approximately the same size, then the anode segments must be given a smaller dimension in the direction towards the current in-feed point. Constantly decreasing segment widths from anode segment to anode segment are advantageous. This measure has the result that the potential differences from one anode segment to the next are approximately the same. The possible mutual effects, i.e. mutual electroplating and etching processes in the anode segments due to the remaining minimal potential differences are prevented by the separating walls 16.

Electrolyte flows out of nozzles or similar into the electrolytic partial cells 14.x. This is not shown in FIGS. 1 and 3. Openings in the separating walls 16 allow an unimpeded outflow of electrolyte and circulation of electrolyte. A thin separating wall design achieves the effect that the electrical shielding effect of the walls on the electric field lines is kept small. A thickness of a few millimeters is sufficient for the separating walls to provide a stable mechanical structure. The layer thickness fall-off directly under the separating walls is thus very small, i.e. it may be ignored.

On use of contact clamps 10, these serve the functions of lateral current in-feed and transport of the circuit boards. If segmented or non-segmented contact rollers as known in circuit board technology are used, then additional transport rollers serve for the transport of the circuit boards 9.

The anode and cathode separation influences the layer thickness distribution of the metal on the surface of the circuit board 9. When electroplating the conductor tracks and other structures, edges are preferentially electrolytically treated. In order to avoid this peak effect, a very small anode/cathode separation—for instance, 1-10 mm, especially 2-5 mm—is advantageous. This also applies for the segmented anodes 13.x. With a small anode/cathode separation, an anode/cathode short-circuit, caused by the circuit boards, must be reliably avoided. Particularly with a separation of only a few millimetres between the electrodes (anode and circuit board as cathode), to this end flat electrically insulating design elements are inserted, which are largely permeable to the electric field. Examples of this are a plastics perforated plate or a frame covered over with plastics fabric located between the electrodes.

If electroplating is to be carried out over the whole surface only, the anode/cathode separation may be selected to be larger. The economic feasibility of the system sets limits in this regard. If the anode/cathode separation is increased, the entire system becomes higher, which significantly increases the system cost. Under these conditions, the rectifiers require greater output voltages due to the increasing electrolyte resistance. This further increases the electrical power to be delivered, so that the energy requirement of the system during operation is greater. An average anode/cathode separation of, for instance, 10-25 mm has proved to be advantageous in practice. The ratio $U_Z/U_S$ becomes larger (FIG. 4). The result of this is that even with a small number of anode segments 5.x, an approximately equal-sized cell voltage $U_Z$ applies per segment 13.x, because in this case $U_Z$ is greater than $U_S$.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

REFERENCE NUMBER LIST 1 bath container
2 electrolyte
3 upper electrolytic cell
4 lower electrolytic cell
5, 5.x, 5.1, 5.2, 5.3, 5.4, 5.5, 5.6, 5.7, 5.8 upper anode
6 upper base layer to be metallized
7 lower anode
8 lower base layer to be metallized
9 workpiece
10 clamp
11 rectifier connection
12 rectifier
13.x, 13.1, 13.2, 13.3, 13.4 anode (counterelectrode) segment
14.x, 14.1, 14.2, 14.3, 14.4 electrolytic partial cell
15.x, 15.1, 15.2, 15.3, 15.4 segment rectifier
16 separating wall
17 container base
18 electrolyte level
19 unsegmented anode counterelectrode)

The invention claimed is:

1. Device for electrolytic treatment of workpieces comprising means for bringing treatment liquid into contact with the workpieces, means for electrical contacting of the workpieces at contact sites and counterelectrodes, which are so arranged that the workpieces may be arranged opposing these, characterized in that the counterelectrodes (5.x) are each subdivided into at least two electrode segments (13.x), that at least one contact-near electrode segment (13.1) and at least one contact-remote electrode segment (13.4) and possibly further electrode segments (13.2, 13.3) arranged between them are provided, whereby each electrode segment (13.x) is fed by a separate current source (15.x) and that separating lines delineating the electrode segments (13.x) run substantially parallel to a transport direction of the workpieces (9) through the device and are offset relative to separating lines between electrode segments (13.x) of an adjacent counterelectrode (5.x) or that the separating lines delineating the electrode segments (13.x) run at an angle α>0 to the transport direction of the workpieces (9).

2. Device according to claim 1, characterized in that control systems are provided with which the current sources (15.x) may be regulated.

3. Device according to claim 1, characterized in that the size of the electrode segments (13.x) is so chosen that the electrical voltages between adjacent electrode segments (13.x) of a counterelectrode (5.x) are substantially the same size.

4. Device according to claim 3, characterized in that the size of the electrode segments (13.x) increases from the at least one contact-near electrode segment (13.1) to the at least one contact-remote electrode segment (13.4).

5. Device according to claim 1 characterized in that the electrode segments (13.x) of a counterelectrode (5.x) are separated from each other by means of electrically insulating design elements (16).

6. Device according to claim 5, characterized in that the electrically insulating design elements (16) are walls which reach close to the workpieces (9).

7. Device according claim 1 claims, characterized in that means are provided for transporting the workpieces (9) through the device in a transport direction and that the counterelectrodes (5.x) are subdivided into electrode segments (13.x) substantially transverse to the transport direction of the workpieces (9).

8. Device according to claim 1, characterized in that the separating lines between electrode segments (13.x) of a counterelectrode (5.x) meet separating lines between electrode segments (13.x) of an adjacent counterelectrode (5.x).

9. Device according to claim 1, characterized in that the separating lines between contact near electrode segments (13.1) run at a smaller angle α to the transport direction of the workpieces (9) than separating lines between contact-remote electrode segments (13.4).

10. Device according to claim 1, characterized in that a plurality of counterelectrodes (5.x) is provided and arranged behind one another seen in the transport direction of the workpieces (9).

11. Device according to claim 10, characterized in that the number of electrode segments (13.x) of each counterelectrode (5.x) decreases in the transport direction of the workpieces (9) and that separating lines delineating the electrode segments (13.x) run substantially parallel to a transport direction of the workpieces (9) through the device and are offset relative to separating lines between electrode segments (13.x) of an adjacent counterelectrode (5.x) or that the separating lines delineating the electrode segments (13.x) run at an angle $\alpha>0$ to the transport direction of the workpieces (9).

12. Method for electrolytic treatment of workpieces in which the workpieces are brought into contact with treatment liquid and an electric current is generated between the workpieces and the counterelectrodes arranged opposing the workpieces, characterized in that the counterelectrodes (5.x) are each subdivided into at least two electrode segments (13.x) and each electrode segment (13.x) is supplied with electric current from a current source (15.x) such that the extent of the electrolytic treatment is equally great on all surface regions of the workpieces (9) or at least approximately equally great and that separating lines delineating the electrode segments (13.x) are arranged to run substantially parallel to a transport direction of the workpieces (9) through the device and are arranged offset relative to separating lines between electrode segments (13.x) of an adjacent counterelectrode (5.x) or that the separating lines delineating the electrode segments (13.x) are arranged to run at an angle $\alpha>0$ to the transport direction of the workpieces (9).

13. Method according to claim 12, characterized in that the size of the current from each current source (15.x) is regulated by a control system.

14. Method according to claim 12, characterized in that the size of the electrode segments (13.x) is so selected that all electrical voltage drops between adjacent electrode segments (13.x) of a counterelectrode (5.x) are equally large.

15. Method according to claim 12, characterized in that the workpieces (9) are transported through a treatment device by suitable transport means in a transport direction and meanwhile electrolytically treated, whereby the counterelectrodes (5.x) are arranged in the device substantially transverse to the transport direction.

16. Device for electrolytic treatment of workpieces comprising means for bringing treatment liquid into contact with the workpieces, means for electrical contacting of the workpieces at contact sites and counterelectrodes, which are so arranged that the workpieces may be arranged opposing these, characterized in that the counterelectrodes (5.x) are each subdivided into at least two electrode segments (13.x), that at least one contact-near electrode segment (13.1) and at least one contact-remote electrode segment (13.4) and possibly further electrode segments (13.2, 13.3) arranged between them are provided, whereby each electrode segment (13.x) is fed by a separate current source (15.x); and that separating lines delineating the electrode segments (13.x) run substantially parallel to a transport direction of the workpeices (9) through the device and are offset relative to separating lines between electrode segments (13.x) of an adjacent counterelectrode (5.x) or that the separating lines delineating the electrode segments (13.x) run at an angle $\alpha>0$ to the transport direction of the workpieces (9); and wherein the size of the electrode segments (13.x) is so chosen that the electrical voltages between adjacent electrode segments (13.x) of a counterelectrode (5.x) are substantially the same size; wherein the electrode segments (13.x) of a counterelectrode (5.x) are separated from each other by means of electrically insulating design elements (16); and wherein means are provided for transporting the workpieces (9) through the device in a transport direction and that the counterelectrodes (5.x) are subdivided into electrode segments (13.x) substantially transverse to the transport direction of the workpieces (9).

17. Method for electrolytic treatment of workpieces in which the workpieces are brought into contact with treatment liquid and an electric current is generated between the workpieces and the counterelectrodes arranged opposing the workpieces, characterized in that the counterelectrodes (5.x) are each subdivided into at least two electrode segments (13.x) and each electrode segment (13.x) is supplied with electric current from a current source (15.x) such that the extent of the electrolytic treatment is equally great on all surface regions of the workpieces (9) or at least approximately equally great; and wherein and that separating lines delineating the electrode segments (13.x) are arranged to run substantially parallel to a transport direction of the workpieces (9) through the device and are arranged offset relative to separating lines between electrode segments (13.x) of an adjacent counterelectrode (5.x) or that the separating lines delineating the electrode segments (13.x) are arranged to run at an angle $\alpha>0$ to the transport direction of the workpieces (9); and wherein the size of the current from each current source (15.x) is regulated by a control system; wherein the size of the electrode segments (13.x) is so selected that all electrical voltage drops between adjacent electrode segments (13.x) of a counterelectrode (5.x) are equally large; and wherein the workpieces (9) are transported through a treatment device by suitable transport means in a transport direction and meanwhile electrolytically treated, whereby the counterelectrodes (5.x) are arranged in the device substantially transverse to the transport direction.

* * * * *